(12) United States Patent
Kachi et al.

(10) Patent No.: US 9,755,037 B2
(45) Date of Patent: Sep. 5, 2017

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Takao Kachi, Tokyo (JP); Masayoshi Tarutani, Tokyo (JP); Yasuhiro Yoshiura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/585,456

(22) Filed: Dec. 30, 2014

(65) Prior Publication Data
US 2015/0294871 A1    Oct. 15, 2015

(30) Foreign Application Priority Data

Apr. 10, 2014 (JP) .................................. 2014-081239

(51) Int. Cl.
*H01L 29/45* (2006.01)
*H01L 21/04* (2006.01)
(Continued)

(52) U.S. Cl.
CPC ........ *H01L 29/456* (2013.01); *H01L 21/0485* (2013.01); *H01L 21/28512* (2013.01);
(Continued)

(58) Field of Classification Search
CPC .. H01L 21/0485; H01L 21/283; H01L 29/417
See application file for complete search history.

(56) References Cited

U.S. PATENT DOCUMENTS

| 5,360,765 A | 11/1994 | Kondo et al. |
| 6,309,965 B1 * | 10/2001 | Matschitsch ........ H01L 23/4827 |
| | | 257/E23.017 |

(Continued)

FOREIGN PATENT DOCUMENTS

| JP | S55-165673 A | 12/1980 |
| JP | S64-039775 A | 2/1989 |

(Continued)

OTHER PUBLICATIONS

An Office Action; "Notification of Reason for Rejection," issued by the Japanese Patent Office on Feb. 7, 2017, which corresponds to Japanese Patent Application No. 2014-081239 and is related to U.S. Appl. No. 14/585,456; with English language partial translation.

(Continued)

*Primary Examiner* — Caridad Everhart
*Assistant Examiner* — Ankush Singal
(74) *Attorney, Agent, or Firm* — Studebaker & Brackett PC

(57) ABSTRACT

According to a first aspect of the present invention, a method of manufacturing semiconductor device includes the step of preparing a silicon substrate. The silicon substrate includes an N-type silicon layer on one surface and at least one of a PN junction, an electrode film, and a protective film on another surface. The method includes the steps of forming a Si—Ti junction by forming a first electrode film made of titanium on the N-type silicon layer; forming a second electrode film made of Al—Si on the first electrode film; forming a third electrode film made of Ni on the second electrode film; and heating the silicon substrate after forming the third electrode film. A titanium silicide layer is not formed between the N-type silicon layer and the first electrode film.

4 Claims, 9 Drawing Sheets

(51) Int. Cl.
*H01L 29/861* (2006.01)
*H01L 29/732* (2006.01)
*H01L 29/417* (2006.01)
*H01L 21/285* (2006.01)

(52) U.S. Cl.
CPC ...... *H01L 21/28568* (2013.01); *H01L 29/417* (2013.01); *H01L 29/41708* (2013.01); *H01L 29/732* (2013.01); *H01L 29/8611* (2013.01)

(56) References Cited

U.S. PATENT DOCUMENTS

| | | | |
|---|---|---|---|
| 2007/0296080 A1 | 12/2007 | Mizuno et al. | |
| 2008/0006856 A1* | 1/2008 | Kobayashi | H01L 29/0834 257/288 |
| 2009/0101190 A1* | 4/2009 | Salami | C03C 3/062 136/244 |
| 2010/0019342 A1* | 1/2010 | Kawano | H01L 29/0619 257/494 |
| 2011/0155967 A1* | 6/2011 | Ochi | H01B 1/16 252/512 |
| 2012/0007241 A1* | 1/2012 | Mizuno | H01L 29/0619 257/751 |
| 2012/0100639 A1* | 4/2012 | Urano | H01L 29/66333 438/4 |

FOREIGN PATENT DOCUMENTS

| | | |
|---|---|---|
| JP | H03-183126 A | 8/1991 |
| JP | H05-021372 A | 1/1993 |
| JP | H11-274102 A | 10/1999 |
| JP | 2007-335431 A | 12/2007 |
| JP | 2008-004739 A | 1/2008 |
| JP | 2010-129585 A | 6/2010 |
| JP | 2013-194291 A | 9/2013 |

OTHER PUBLICATIONS

An Office Action issued by the Chinese Patent Office dated Apr. 24, 2017, which corresponds to Chinese Patent Application No. 201510160872.9 and is related to U.S. Appl. No. 14/585,456; with partial English language translation.

An Office Action issued by the Japanese Patent Office dated Jul. 4, 2017, which corresponds to Japanese Patent Application No. 2014-081239 and is related to U.S. Appl. No. 14/585,456; with partial English language translation.

\* cited by examiner

SEMICONDUCTOR DEVICE AND METHOD OF MANUFACTURING SEMICONDUCTOR DEVICE

BACKGROUND OF THE INVENTION

Field of the Invention

The present invention relates to a semiconductor device and a method of manufacturing a semiconductor device.

Background Art

Heretofore, a semiconductor device including a multilayer electrode film provided on a silicon substrate has been known. Such semiconductor devices are disclosed in, for example, Japanese Patent Laid-Open Nos. 2013-194291 and 2010-129585. For example, a structure illustrated in FIG. 6 of Japanese Patent Laid-Open No. 2013-194291 includes barrier metal such as Ti, an Al alloy electrode made of AlSi alloy or the like, a Ni electrode, and an Au electrode, which are stacked on a surface of a silicon substrate.

A Si—Ti junction formed by providing an electrode made of titanium (Ti) on an N-type silicon (Si) has favorable ohmic contact properties. To obtain a strong Si—Ti junction, ideally, it is preferable to carry out a high-temperature process at approximately 700° C. to obtain a reaction layer of titanium silicide or the like. However, such a high-temperature process has the problem that functions of an element structure portion, an electrode film, and a protective film already formed on a semiconductor substrate are deteriorated. One conceivable way to cope with this problem is to avoid carrying out such a high-temperature process and use a Si—Ti junction without a reaction layer of titanium silicide or the like. However, in that case, there is a problem that a heat treatment process, which is 200 degrees Celsius or higher, performed on a multilayer electrode film formed by overlaying another electrode film on the titanium electrode causes Si—Ti interface delamination due to stress in the multilayer electrode film.

SUMMARY OF THE INVENTION

The present invention has been made to solve the above-described problems. An object of the present invention is to provide a semiconductor device and a semiconductor device fabrication method which restrain the deterioration of functions of a protective film and the like formed on a silicon substrate while obtaining favorable electrical characteristics and which can also restrain Si—Ti interface delamination.

According to a first aspect of the present invention, a method of manufacturing semiconductor device includes the step of preparing a silicon substrate. The silicon substrate includes an N-type silicon layer on one surface and at least one of a PN junction, an electrode film, and a protective film on another surface. The method includes the steps of forming a Si—Ti junction by forming a first electrode film made of titanium on the N-type silicon layer; forming a second electrode film made of Al—Si on the first electrode film; forming a third electrode film made of Ni on the second electrode film; and heating the silicon substrate after forming the third electrode film. A titanium silicide layer is not formed between the N-type silicon layer and the first electrode film.

According to a second aspect of the present invention, a semiconductor device includes: a silicon substrate, and a first to third electrode films. The silicon substrate includes an N-type silicon layer on one surface and at least one of a PN junction, an electrode film, and a protective film on another surface. The first electrode film made of titanium is formed on the N-type silicon layer. The first electrode film forms a Si—Ti junction. Titanium silicide is not formed between the first electrode film and the N-type silicon layer. The second electrode film made of Al—Si is formed on the first electrode film. The third electrode film made of Ni is formed on the second electrode film.

Other and further objects, features and advantages of the invention will appear more fully from the following description.

DETAILED DESCRIPTION OF THE PREFERRED EMBODIMENTS

Embodiment 1

Figure 1:
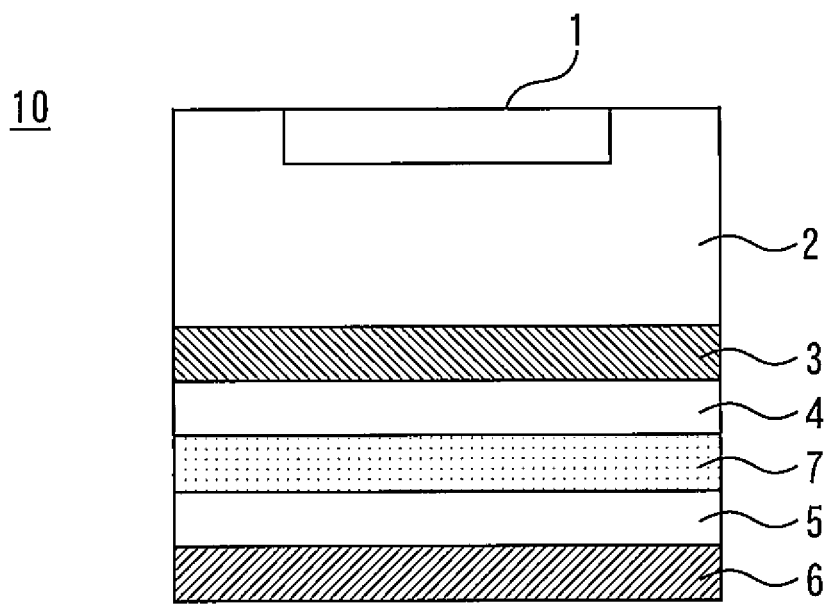
FIG. 1 is a view showing a semiconductor device according to Embodiment 1 of the present invention.

FIG. 1 is a view showing a semiconductor device 10 according to Embodiment 1 of the present invention. The semiconductor device 10 includes an N-type silicon substrate 2. The N-type silicon substrate 2 has an anode layer 1 on one surface thereof and a cathode layer 3 on other surface thereof. The anode layer 1 is made of P-type silicon and forms a PN junction with the N-type silicon substrate 2. The cathode layer 3 is made of an N-type silicon layer. The semiconductor device 10 further includes a first electrode film 4 formed on the cathode layer 3 and made of titanium to form a SiTi junction, a second electrode film 7 formed on the first electrode film 4 and made of Al—Si to form a Ti—AlSi junction, a third electrode film 5 formed on the second electrode film 7 and made of Ni to form an AlSi—Ni junction, and a fourth electrode film 6 formed on the third electrode film 5 and made of Au. These electrode films constitute a "multilayer electrode film." The semiconductor device 10 is a diode having electrodes respectively formed on front and back surfaces of the N-type silicon substrate 2. Further, an electrode film and a protective film, which are not shown, may also be provided on the anode layer 1.

Figure 2:
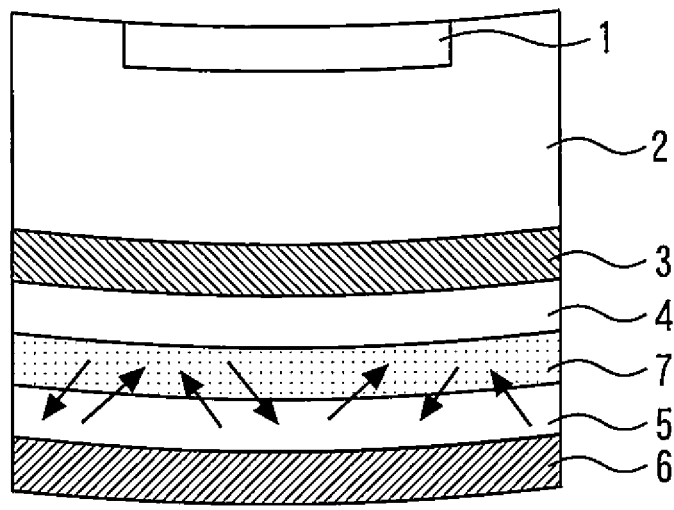
FIG. 2 is a view for explaining function and effect of the semiconductor device according to Embodiment 1 of the present invention.
Figure 3:
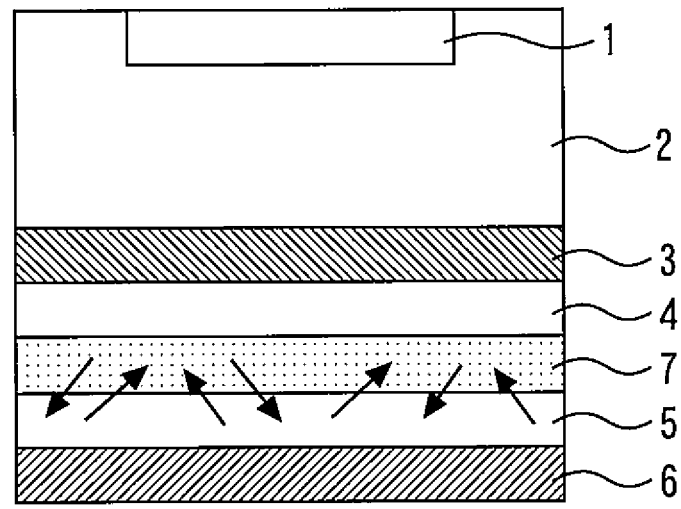
FIG. 3 is a view for explaining function and effect of the semiconductor device according to Embodiment 1 of the present invention.

FIGS. 2 and 3 are views for explaining functions and effects of the semiconductor device 10 according to Embodiment 1 of the present invention. Arrows in FIGS. 2 and 3 schematically represent forces exerted between the second electrode film 7 made of Al—Si and the third electrode film 5 made of Ni. In Embodiment 1, the second electrode film 7 made of Al—Si is formed between the Si—Ti junction (i.e., the junction between the cathode layer 3 and the first electrode film 4) and Ni (i.e., the third electrode film 5). This can reduce stress imposed on the Si—Ti as shown in FIGS. 2 and 3 when heat treatment (for example, 200 degrees Celsius or higher) is carried out after electrode formation with no reaction layer of titanium silicide or the like formed, and also can restrain Si—Ti interface delamination after the heat treatment. As described above, with this embodiment, the deterioration of functions of the structures (i.e., the PN junction, the electrode film, and the protective film) formed on the surface on the anode layer 1 side can be avoided, and Si—Ti interface delamination caused by stress occurring in the multilayer electrode film during a thermal process after electrode formation can be restrained with a Si—Ti junction having favorable electrical characteristics maintained.

Figure 4:
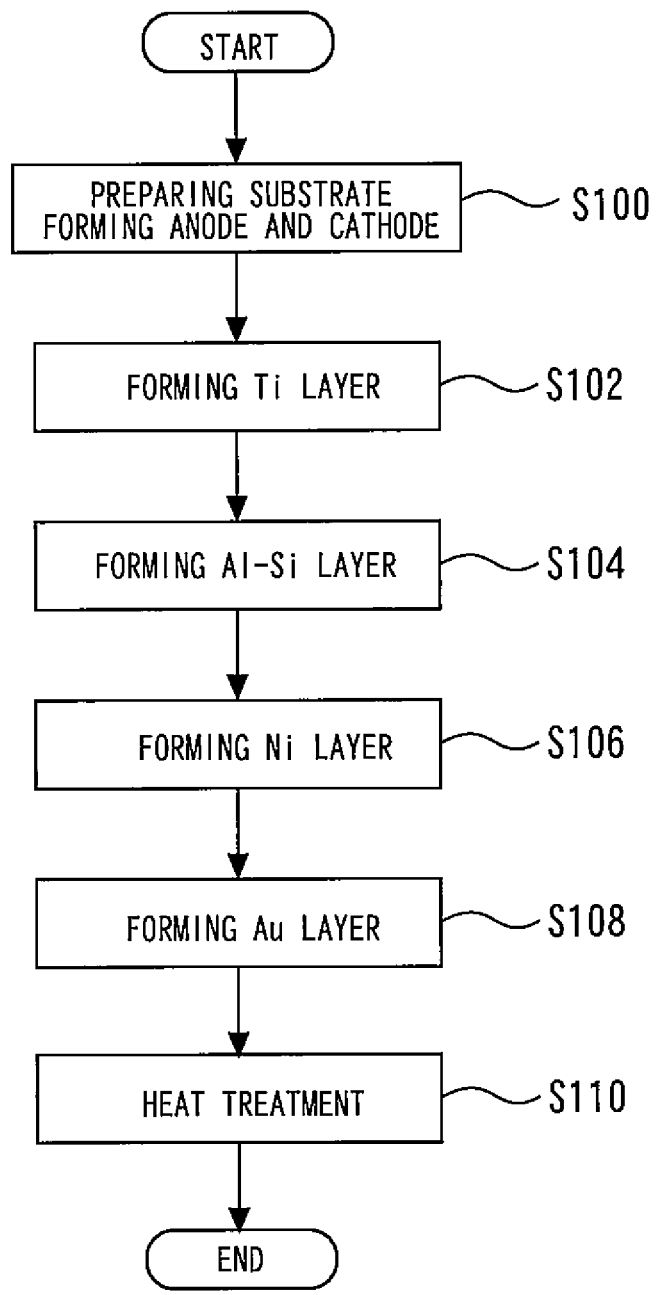
FIG. 4 is a flowchart showing a method of manufacturing the semiconductor device according to Embodiment 1 of the present invention.

FIG. 4 is a flowchart showing a method of manufacturing the semiconductor device 10 according to Embodiment 1 of the present invention. First, the N-type silicon substrate 2 is prepared, and the step of forming the anode layer 1 and the cathode layer 3 on the N-type silicon substrate 2 is carried out (step S100). In addition, another electrode film and a protective film may be provided on the anode layer 1. Next, the step of forming the first electrode film 4 made of titanium on the cathode layer 3 is carried out (step S102). Then, the step of forming the second electrode film 7 made of Al—Si on the first electrode film 4 is carried out (step S104). Subsequently, the step of forming the third electrode film 5 made of Ni on the second electrode film 7 is carried out (step S106). Then, the step of forming the fourth electrode film 6 made of Au on the third electrode film 5 is carried out (step S108). After that, heat treatment (for example, 200 degrees Celsius or higher) after multilayer electrode formation is carried out (step S110). By carrying out these steps, the semiconductor device 10 described with reference to FIG. 1 is obtained.

One way to obtain strong Si—Ti bonding is to form a reaction layer of titanium silicide or the like. However, the formation of such a reaction layer requires a high-temperature process at approximately 700° C. In the case where such a high-temperature process is carried out after the anode layer 1, and an electrode film and a protective film on the anode layer 1 side, which are not shown, have been formed on the N-type silicon substrate 2, there is a problem that required functions of these films are deteriorated. Accordingly, this embodiment avoids carrying out such a high-temperature process.

Supposing that heat treatment is carried out after multilayer electrode formation with no titanium silicide formed, stress occurs in the third electrode film 5 made of Ni and formed on the first electrode film 4 made of Ti due to irreversible changes caused by grain growth and the like, and this stress remains after heat treatment. In this embodiment, since the second electrode film 7 is provided, stress imposed on the Si—Ti can be reduced. Thus, Si—Ti interface delamination after heat treatment can be retrained without the formation of the aforementioned reaction layer of titanium silicide or the like.

Embodiment 2

Figure 5:
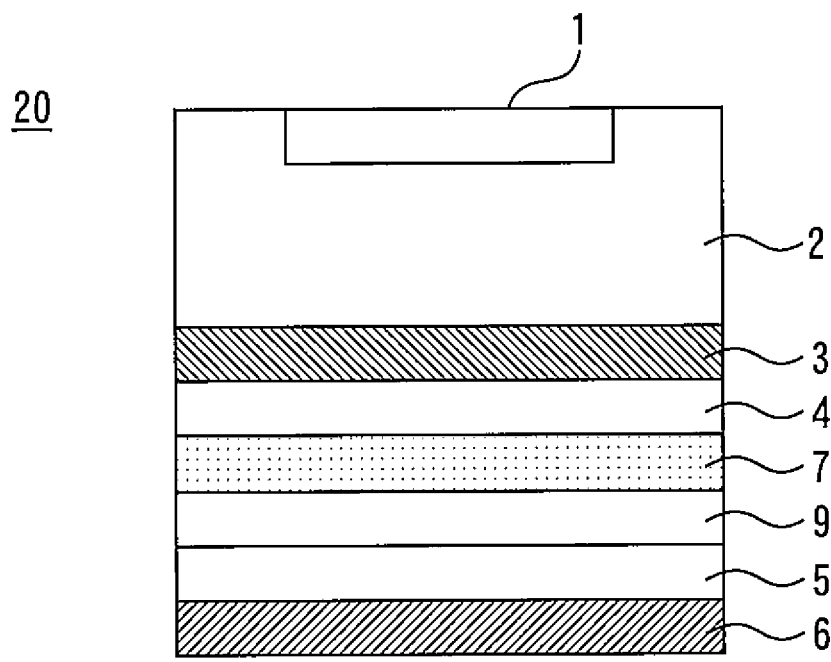
FIG. 5 is a view showing a semiconductor device according to Embodiment 2 of the present invention.

FIG. 5 is a view showing a semiconductor device 20 according to Embodiment 2 of the present invention. The semiconductor device 20 further includes a fifth electrode film 9 made of titanium between the third electrode film 5 and the second electrode film 7. Except for that, the semiconductor device 20 has the same configuration of the semiconductor device 10 of Embodiment 1. Forming an alloy layer between Al—Si and solder is difficult. The diffusion of solder into Al—Si causes an ohmic failure and an adhesion strength reduction, which results in delamination. To cope with this, a multilayer electrode is used which includes a Ni electrode film as a film for forming an alloy layer with solder and a Ti electrode film as a barrier metal layer for preventing the diffusion of solder into an ohmic electrode. To prevent the diffusion of solder into Al—Si, the fifth electrode film 9 made of Ti is added to the semiconductor device 10 of Embodiment 1 to be positioned between the second electrode film 7 made of Al—Si and the third electrode film 5 made of Ni. This makes it possible to form Al—Si between the Si—Ti junction and Ni with a Si—Ti junction having favorable electrical characteristics maintained. Thus, delamination at the Si—Ti interface caused by stress occurring from the multilayer electrode film due to a thermal process after electrode formation can be restrained, and solderability deterioration can be restrained by preventing the diffusion of solder into Al—Si.

Figure 6:
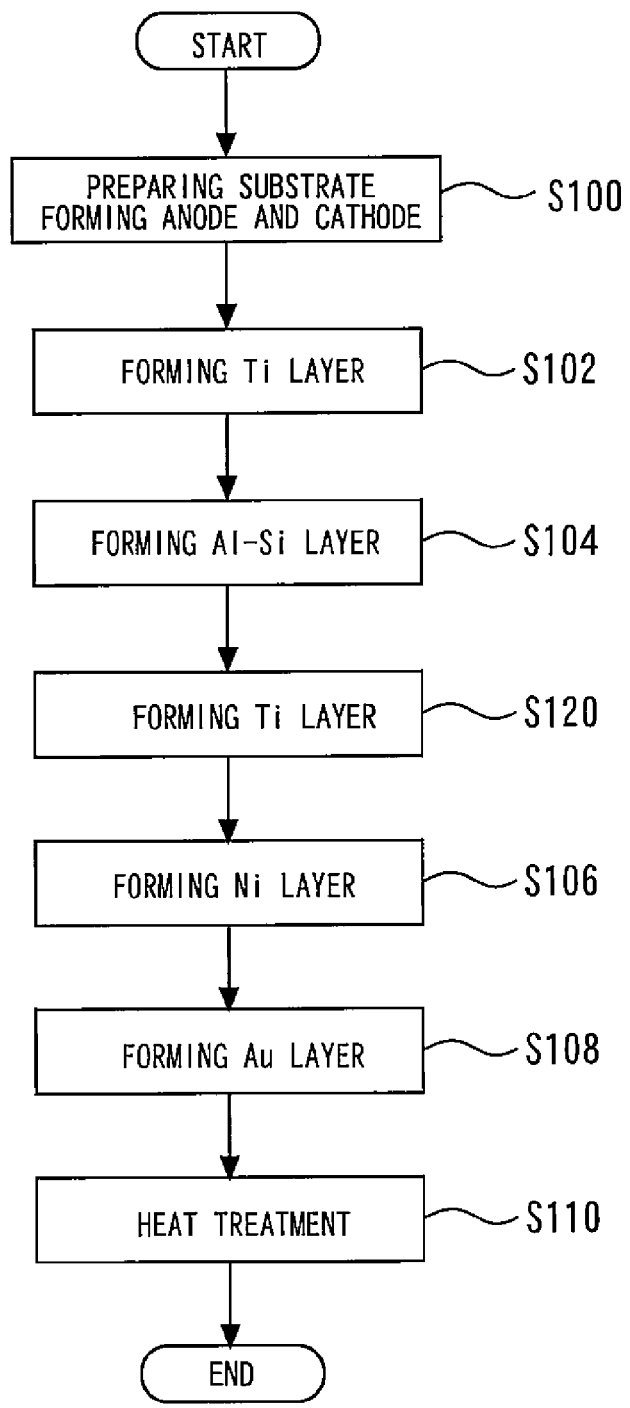
FIG. 6 is a flowchart showing a method of manufacturing the semiconductor device according to Embodiment 2 of the present invention.

FIG. 6 is a flowchart showing a method of manufacturing the semiconductor device 20 according to Embodiment 2 of the present invention. The step (step S120) of forming the fifth electrode film 9 made of titanium on the second electrode film 7 is added before the step S106 of forming the third electrode film 5. Except for that, the method of Embodiment 2 is the same as the fabrication method represented by the flowchart in FIG. 4.

Embodiment 3

Figure 7:
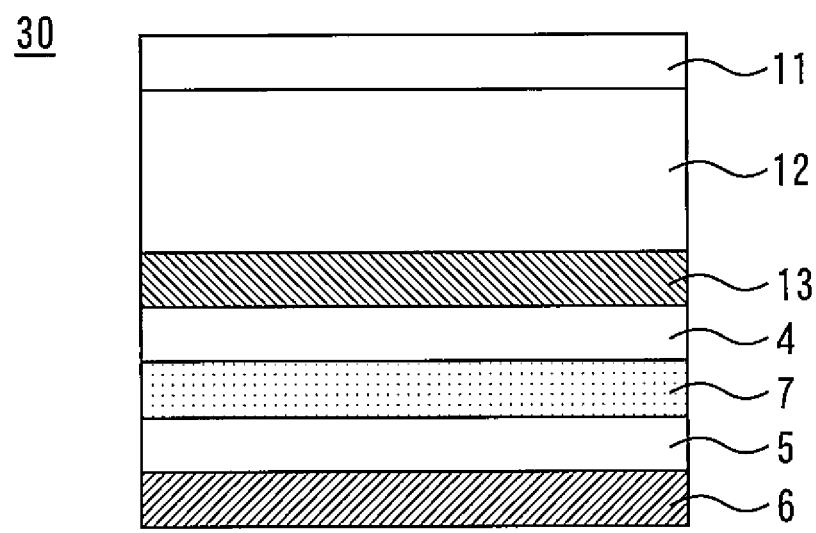
FIG. 7 is a view showing a semiconductor device according to Embodiment 3 of the present invention.
Figure 8:
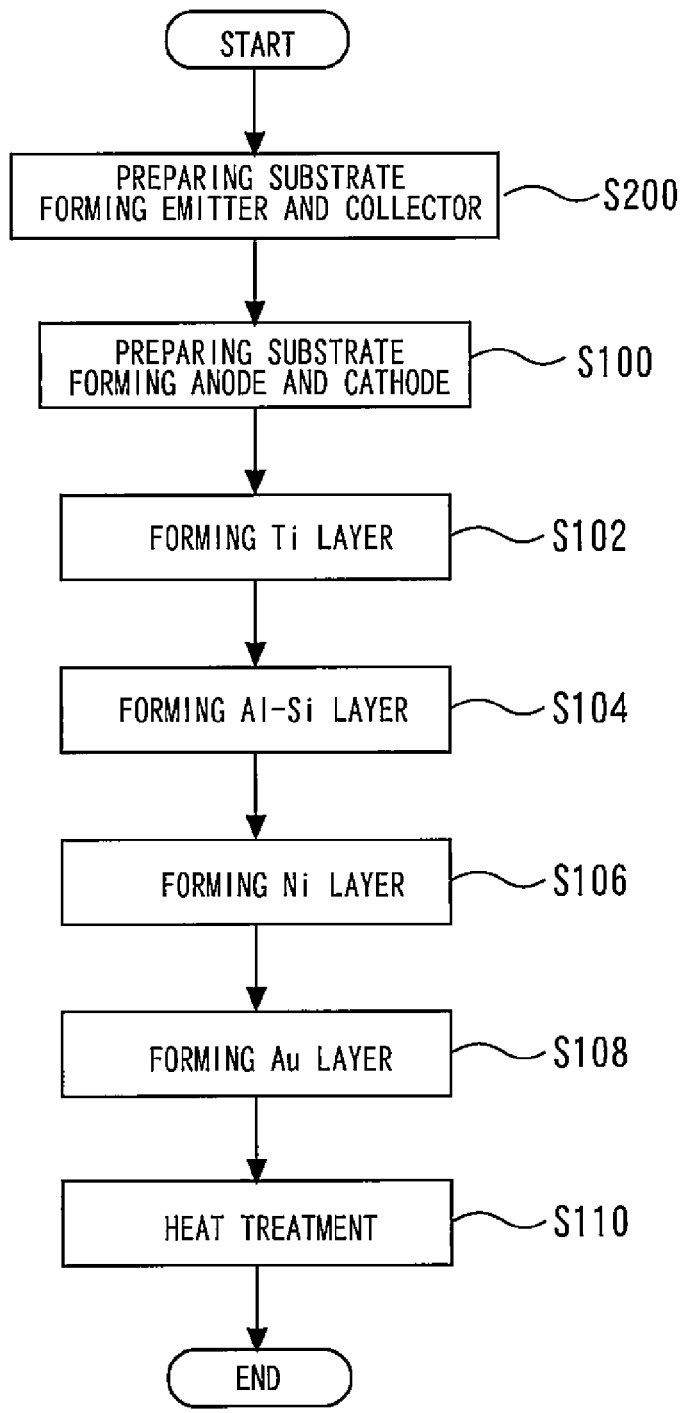
FIG. 8 is a flowchart showing a method of manufacturing the semiconductor device according to Embodiment 3 of the present invention.

FIG. 7 is a view showing a semiconductor device 30 according to Embodiment 3 of the present invention. The semiconductor device 30 is an NPN transistor. The semiconductor device 30 includes a P-type silicon substrate 12. The P-type silicon substrate 12 has an emitter layer 11 made of N-type silicon on one surface thereof and a collector layer 13 made of N-type silicon on other surface thereof. The P-type silicon substrate 12 serving as a base layer, the emitter layer 11, and the collector layer 13 constitute an NPN transistor. FIG. 8 is a flowchart showing a method of manufacturing the semiconductor device 30. Instead of step S100 in FIG. 4, the emitter layer 11 made of N-type silicon is provided on one surface of the P-type silicon substrate 12, and the collector layer 13 made of N-type silicon is provided on other surface thereof. Thus, as in Embodiment 1, while favorable electrical characteristics are obtained, the deterioration of functions of the protective film and the like formed on the P-type silicon substrate 12 can be restrained, and Si—Ti interface delamination can be restrained.

Embodiment 4

Figure 9:
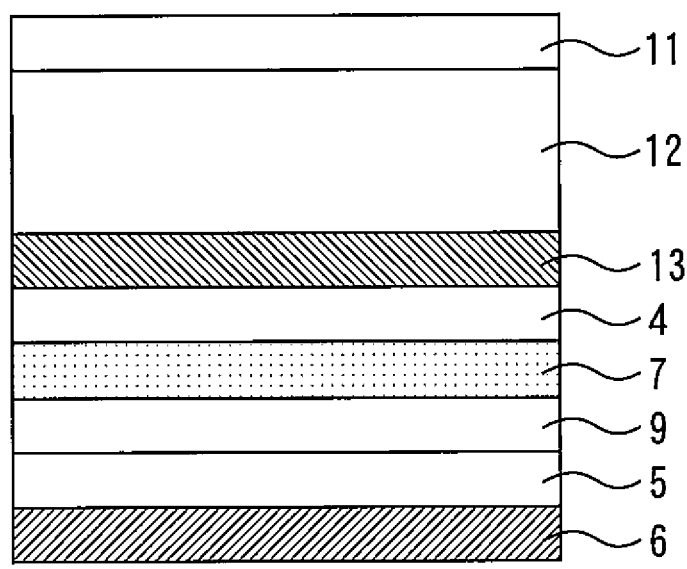
FIG. 9 is a view showing a semiconductor device according to Embodiment 4 of the present invention.
Figure 10:
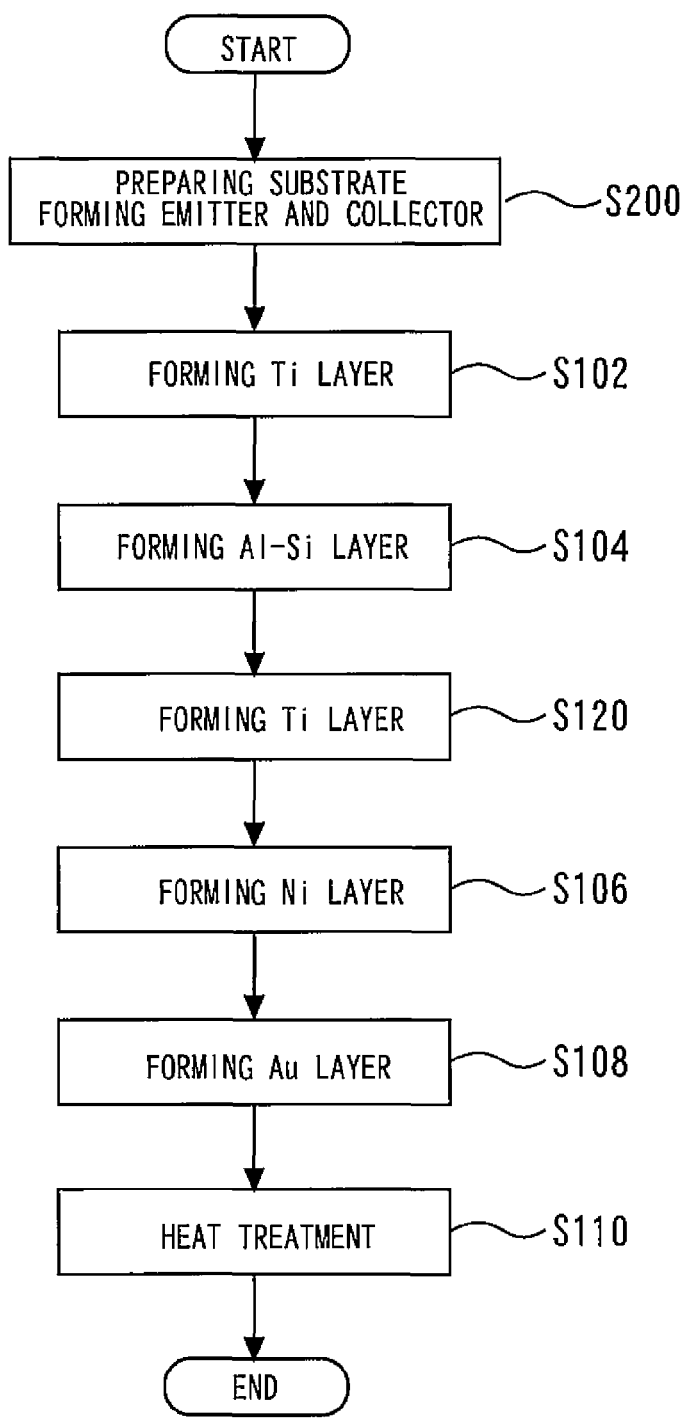
FIG. 10 is a flowchart showing a method of manufacturing the semiconductor device according to Embodiment 4 of the present invention.

FIG. 9 is a view showing a semiconductor device 40 according to Embodiment 4 of the present invention. The semiconductor device 40 is obtained by adding the fifth electrode film 9 made of Ti to the semiconductor device 30. Except for that, the semiconductor device 40 has the same configuration as the semiconductor device 30. FIG. 10 is a flowchart showing a method of manufacturing the semiconductor device 40. This flowchart is obtained by adding step S120 according to Embodiment 2 to the flowchart in FIG. 8. Thus, Si—Ti interface delamination caused by stress occurring from the multilayer electrode film due to a thermal process after electrode formation can be restrained, and solderability deterioration can be restrained by preventing the diffusion of solder into Al—Si.

The features and advantages of the present invention may be summarized as follows. In the present invention, while an ohmic contact of a Si—Ti junction is obtained, the deterioration of functions of a protective film and the like on a silicon substrate is avoided by not forming titanium silicide, which requires a high-temperature process, and a second electrode film made of Al—Si is inserted to restrain Si—Ti interface delamination. Thus, while favorable electrical characteristics are obtained, the deterioration of the functions of the protective film and the like formed on the silicon substrate is restrained, and Si—Ti interface delamination can also be restrained.

Obviously many modifications and variations of the present invention are possible in the light of the above teachings. It is therefore to be understood that within the scope of the appended claims the invention may be practiced otherwise than as specifically described. The entire disclosure of Japanese Patent Application No. 2014-081239, filed on Apr. 10, 2014 including specification, claims, drawings and summary, on which the Convention priority of the present application is based, is incorporated herein by reference in its entirety.

What is claimed is:

1. A semiconductor device comprising:
a silicon substrate including an N-type silicon layer on one surface and at least one of a PN junction, an electrode film, and a protective film on another surface;
a first electrode film made of titanium formed directly on the N-type silicon layer, the first electrode film forming a Si—Ti junction, titanium silicide not formed between the first electrode film and the N-type silicon layer;
a second electrode film made of Al—Si formed on the first electrode film; and
a third electrode film made of Ni formed on the second electrode film.

2. The semiconductor device according to claim 1, further comprising: a titanium electrode film between the second electrode film and the third electrode film.

3. A semiconductor device comprising:
an N-type silicon substrate including an anode layer made of P-type silicon on a first surface and a cathode layer made of N-type silicon on a second surface opposite the first surface;
a first electrode film made of titanium formed directly on the cathode layer, the first electrode film forming a Si—Ti junction, titanium silicide not formed between the first electrode film and the cathode layer;
a second electrode film made of Al—Si formed on the first electrode film; and
a third electrode film made of Ni formed on the second electrode film.

4. A semiconductor device comprising:
a silicon substrate including an N-type silicon layer on one surface and at least one of a PN junction, an electrode film, and a protective film on another surface;
a first electrode film made of titanium formed on the N-type silicon layer, the first electrode film forming a Si—Ti junction, titanium silicide not formed between the first electrode film and the N-type silicon layer;
a second electrode film made of Al—Si formed on the first electrode film; and
a third electrode film made of Ni formed on the second electrode film,
wherein the silicon substrate is a P-type silicon substrate, the N-type silicon layer is formed on one surface of the P-type silicon substrate, another N-type silicon layer is formed on another surface of the P-type silicon substrate.

* * * * *